(12) United States Patent
Acar et al.

(10) Patent No.: US 7,191,113 B2
(45) Date of Patent: Mar. 13, 2007

(54) METHOD AND SYSTEM FOR SHORT-CIRCUIT CURRENT MODELING IN CMOS INTEGRATED CIRCUITS

(75) Inventors: Emrah Acar, Austin, TX (US);
Ravishankar Arunachalam, Austin, TX (US); Sani Richard Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 693 days.

(21) Appl. No.: 10/322,089

(22) Filed: Dec. 17, 2002

(65) Prior Publication Data

US 2004/0117169 A1    Jun. 17, 2004

(51) Int. Cl.
*G06F 17/50* (2006.01)
*G01R 31/00* (2006.01)
*G01R 21/00* (2006.01)

(52) U.S. Cl. ............................. 703/15; 703/14; 703/18; 702/59; 702/60; 702/64; 702/70; 702/79; 716/5; 716/17; 716/18

(58) Field of Classification Search ................. 703/15, 703/14, 19, 18; 702/59, 60, 64, 70, 79; 716/5, 716/17, 18
See application file for complete search history.

(56) References Cited

U.S. PATENT DOCUMENTS

| | | | | |
|---|---|---|---|---|
| 5,453,991 A | * | 9/1995 | Suzuki et al. | 714/724 |
| 5,835,380 A | * | 11/1998 | Roethig | 716/2 |
| 5,923,712 A | * | 7/1999 | Leyendecker et al. | 375/297 |
| 5,933,358 A | * | 8/1999 | Koh et al. | 703/14 |
| 6,066,177 A | * | 5/2000 | Hatsuda | 703/19 |
| 6,209,122 B1 | * | 3/2001 | Jyu et al. | 716/6 |
| 6,405,348 B1 | * | 6/2002 | Fallah-Tehrani et al. | 716/4 |

(Continued)

OTHER PUBLICATIONS

Anas A. Hamoui, and Nicholas C. Rumin, An Analytical Model for Current, Delay, and Power Analysis of Submicron CMOS Logic Circuits,Oct. 2001,IEEE,vol. 47,No. 10,pp. 999-1007.*

(Continued)

*Primary Examiner*—Kamini Shah
*Assistant Examiner*—Kibrom Gebresilassie
(74) *Attorney, Agent, or Firm*—Mitch Harris Atty at Law, LLC; Andrew M. Harris; Casimer K. Salys

(57) ABSTRACT

A method and system for short-circuit current modeling in CMOS circuit provides improved accuracy for logic gate power dissipation models in computer-based verification and design tools. The model determines the short circuit current for each complementary pair within a CMOS circuit. Input and output voltage waveforms provided from results of a timing analysis are used to model the behavior one device of the complementary pair. The device is selected as the limiting device (the device transitioning to an "off state) from the direction of the logic transition being modeled, which is also the device that is not charging or discharging the output load. Therefore, the current through the selected device can be determined from the input and output waveforms and is equal to the short-circuit current prior to the saturation of the selected device. One or more short-circuit current points can be determined from the model and used to generate a polygonal waveform model of the short-circuit current, or can be used along with the width (period) of the waveform to calculate short-circuit power dissipation directly.

27 Claims, 4 Drawing Sheets

U.S. PATENT DOCUMENTS

| | | | |
|---|---|---|---|
| 6,731,129 B1* | 5/2004 | Belluomini et al. | 324/765 |
| 6,975,978 B1* | 12/2005 | Ishida et al. | 703/15 |
| 2002/0016950 A1* | 2/2002 | Sakamoto | 716/6 |
| 2002/0042704 A1* | 4/2002 | Najm et al. | 703/14 |
| 2002/0065643 A1* | 5/2002 | Hirano et al. | 703/19 |
| 2002/0174409 A1* | 11/2002 | Cohn et al. | 716/6 |
| 2002/0183990 A1* | 12/2002 | Wasynczuk et al. | 703/2 |
| 2003/0070150 A1* | 4/2003 | Allen et al. | 716/6 |
| 2003/0189865 A1* | 10/2003 | Ausserlechner et al. | 365/200 |
| 2004/0113680 A1* | 6/2004 | Dray | 327/524 |
| 2004/0158809 A1* | 8/2004 | Kashimoto et al. | 716/21 |
| 2006/0225009 A1* | 10/2006 | Reddy et al. | 716/4 |

OTHER PUBLICATIONS

Anas A. Hamoui, and Nicholas C. Rumin, "An Analytical Model for Current, Delay, and Power Analysis of Submicron CMOS Logic Circuits", IEEE Transactions on Circuits and Systems, vol. 47, No. 10, Oct. 2000, pp. 999-1007.*

E. Acar, R. Arunachalam, and S. R. Nassif, "Predicting Short Circuit Power From Timing Models", Nov. 14, 2002, total pages of 6.*

* cited by examiner

METHOD AND SYSTEM FOR SHORT-CIRCUIT CURRENT MODELING IN CMOS INTEGRATED CIRCUITS

BACKGROUND OF THE INVENTION

1. Field of the Invention

The present invention generally relates to systems for modeling the behavior of integrated circuits such as verifiers, simulators and design tools, and more particularly to a computer program that includes modeling of digital integrated circuit power distribution network current waveforms.

2. Description of Related Art

Design tools and verification tools are necessary for modeling large-scale digital integrated circuits such as Very Large Scale Integration (VLSI) circuits. Millions of transistors and logic gates are often combined on a single die and the performance of the die is modeled using software that models the performance of the overall die based on known (modeled) performance of individual gates, inverter/buffer models of gates, or models of larger functional blocks.

Power supply current for individual gates or blocks combines to generate the power requirements for the overall die, and will typically combine in sub-groups to several power and ground pins that are connected external to the integrated circuit package. The power supply pin connections are typically inductive, while the external power supplies to which the power pins connect are typically capacitive loads. The inductive pin characteristic leads to voltage noise as the changing power supply currents generate voltage drops across the pin inductances. Therefore, knowledge of power supply currents at power nodes of logic gates or larger functional blocks is valuable for knowing overall current consumption and time-dependent behavior and for induced/radiated noise modeling. The overall current consumption along with the power supply voltage(s) determine power dissipation, which must also be determined for analysis of thermal characteristics and failure rates of an integrated circuit.

A large component of the power supply current generated in Complementary Metal Oxide Semiconductor (CMOS) integrated circuits is the short-circuit, or "cross-conduction" current drawn by the transistors of a complementary pair at times when the complementary pair switches state and both transistors conducting. Short-circuit current modeling is critical for accurate modeling of the power distribution network analysis. The short-circuit current can also be largely determinative of power dissipation within a CMOS integrated circuit, which is often referred to as short-circuit power. Therefore, it is critical also to accurately model short-circuit current in order to model device power dissipation.

Present techniques for short-circuit current and short-circuit power modeling typically calculate the short-circuit currents based on formulas derived for specific circuits using simplified device models, such as an inverter model with a capacitive load. Another technique is a table-based approach that requires extensive circuit simulation and memory resources to determine exact circuit performance separate from the timing simulations. The present short-circuit modeling techniques used typically are not integrated with timing models for the logic circuits and thus the short-circuit and timing performance modeled may not be consistent. Further, the simplified models presently used for short-circuit current modeling are not integrated with more sophisticated analytical models used within the timing analysis and for those reasons produce results with a low accuracy and cannot accurately determine the short-circuit current for complex circuit models such as logic circuits having reactive loading parameters.

Therefore, it is desirable to implement an improved CMOS short-circuit current and short-circuit power modeling algorithm. It would further be desirable to provide an algorithm that is compatible with existing circuit timing models.

SUMMARY OF THE INVENTION

The objective of providing an improved short-circuit current modeling algorithm is achieved in a method for modeling characteristics of a logical circuit. The model determines the short circuit current for each complementary pair within a CMOS circuit. The method receives input and output waveforms of the complementary circuit from a timing model and calculates the current through a transistor of the complementary pair for a plurality of points of the input and output waveforms corresponding to time values. The short-circuit current for the complementary pair is determined from a model of the device transitioning to the "off" state, since the other transistor is supplying the load current for the transition and the modeled transistor is the limiting factor in the short-circuit current prior to reaching a saturation current value. A maximum short-circuit current may be determined from the method and used to determined the apex of a triangular waveform model for the short-circuit current. The short-circuit power can then be directly calculated from the maximum short-circuit current and the width (time period) of the triangular waveform. Alternatively, a saturation current can be determined and used to form the apex of the triangular current value. Also alternatively, both the saturation current and the maximum current can be used to form a trapezoidal waveform model.

The invention may further be embodied in a workstation computer executing program instructions for carrying out the steps of the method, and in a computer program product having a storage media for those program instructions.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

Figure 1:
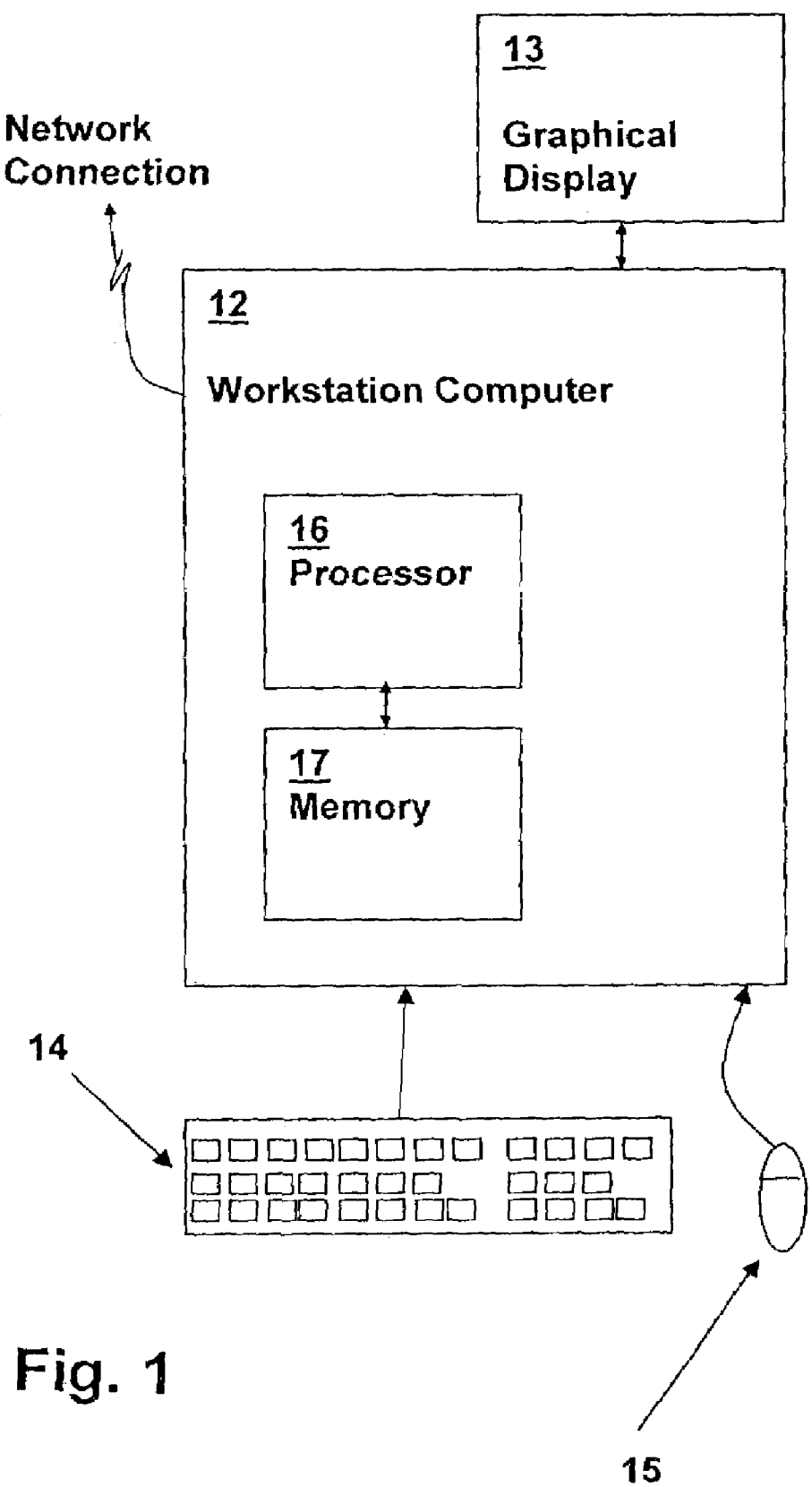
FIG. 1 is a pictorial diagram of a workstation computer system in which methods in accordance with an embodiment of the present invention are performed.

Referring to the figures, and particularly to FIG. 1, a workstation computer system, in which methods according to an embodiment of the present invention are performed, is depicted. A workstation computer 12, having a processor 16 coupled to a memory 17, for executing program instructions from memory 17, wherein the program instructions include program instructions for executing one or more methods in accordance with an embodiment of the present invention.

Workstation computer 12 is coupled to a graphical display 13 for displaying program output such as simulation results and circuit structure input and verification programs implementing embodiments of the present invention. Workstation computer 12 is further coupled to input devices such as a mouse 15 and a keyboard 14 for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 12.

Figure 2A:
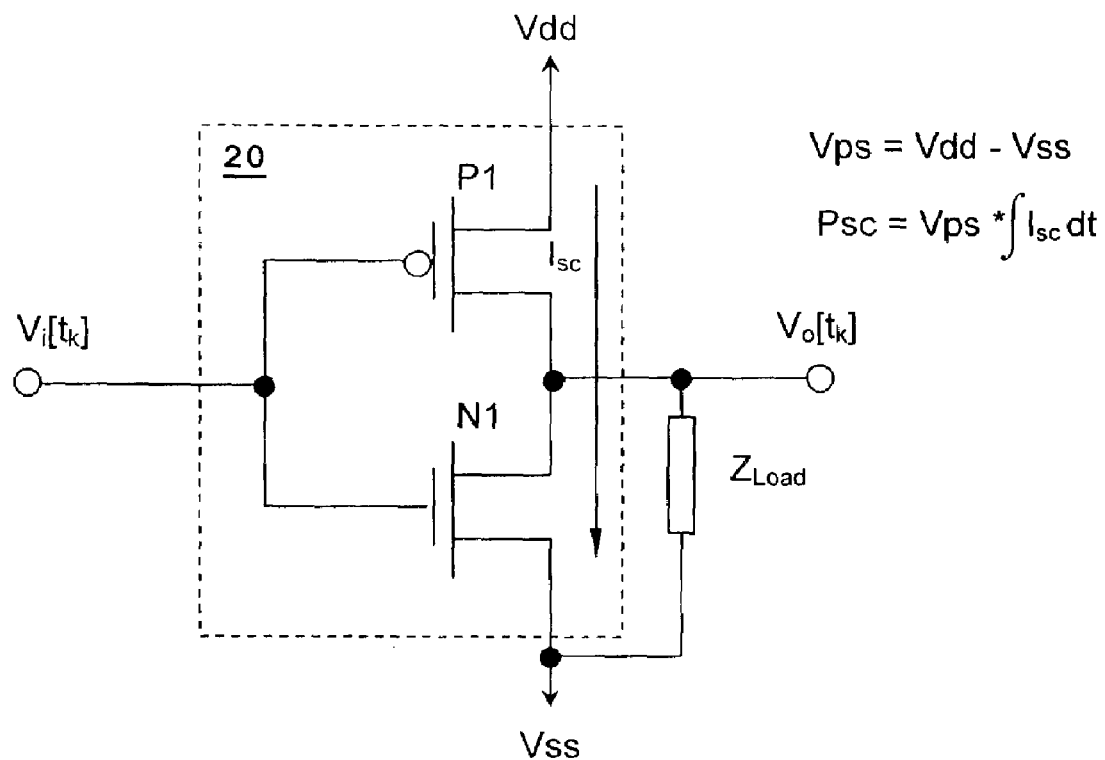
FIG. 2A is a block diagram of a complementary circuit representation in accordance with methods embodying the present invention.

Referring now to FIG. 2A, a block diagram of a complementary inverter circuit 20 for illustrating the models of the present invention is shown. Transistors P1 and N1 are wired as a complementary pair having gates coupled to an input logic signal $V_i$ and sources coupled to an output signal $V_o$. Timing simulations produce input and output voltage waveforms as discrete piecewise linear or non-linear models at particular times $t_k$, and expressed as sequences $V_i[t_k]$ and $V_o[t_k]$. $V_o[t_k]$ takes into account loading effects shown lumped as impedance $Z_{Load}$. Short-circuit current $I_{sc}$ is the current conducted through transistors P1 and N1 when the input signal Vi (and thus output signal Vo) transitions from one logic state to another and short-circuit power $P_{sc}$ is the power dissipation due to the short-circuit current, shown equal to the integral of the $I_{sc}$ waveform multiplied by the power supply voltage impressed across transistors P1 and N1.

Figure 2B:
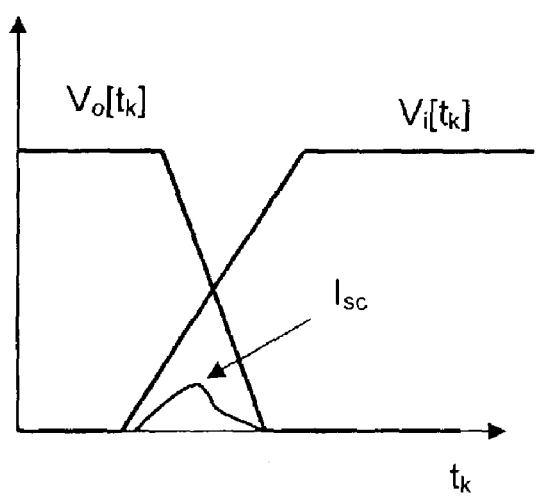
FIG. 2B is a graph depicting voltage and current waveforms within the complementary circuit of FIG. 2A.

FIG. 2B depicts the relationship of simulated voltage waveforms within inverter 20, produced by timing model simulation algorithms, and the actual short circuit current $I_{sc}$ through transistors P1 and N1.

Figure 3A:
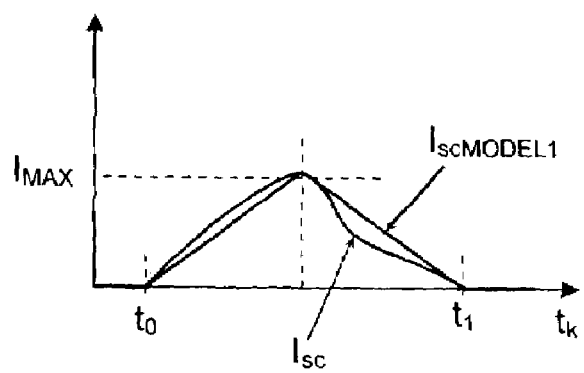
FIG. 3A is a first short-circuit current waveform model in accordance with an embodiment of the present invention.

Referring now to FIG. 3A, a first short-circuit current waveform model in accordance with an embodiment of the present invention is shown. A triangular current waveform is generated based on a determination of the maximum short-circuit current. For a rising input, the short-circuit current is determined by taking each of the values of the input voltage waveform $V_i[t_k]$ and the output voltage waveform $V_o[t_k]$ and calculating the current through transistor P1 using a device model for transistor P1. Since output voltage is falling, the output load is being discharged, therefore the load current discharged from the output is drawn through transistor N1. The current through transistor P1 is only the short-circuit current $I_{sc}$, and thus can be determined directly from the gate-source and drain-source voltages of transistor P1. The converse is true for a rising output voltage (falling input voltage) and transistor N1 is selected for analysis of the short-circuit current $I_{sc}$ for high-to-low logic level input transitions.

If the entire waveform model is to be generated for combination with other generated waveforms for modeling the total current on a power distribution network line, all of the voltage points will be analyzed to produce triangular waveform simulations that can be summed or used in more complex coupling models to determine total power dissipation and maximum currents. Otherwise, it is possible to curtail calculation once the maximum current has been reached or to use a search algorithm to minimize the number of calculated current values. Only a single current value $I_{max}$ is needed, as the triangular waveshape is fit to have an apex at $I_{max}$ and a base extending from time $t_o$ (the delay time) to time $t_1$ (the time at which the short-circuit current falls to substantially zero).

Figure 3B:
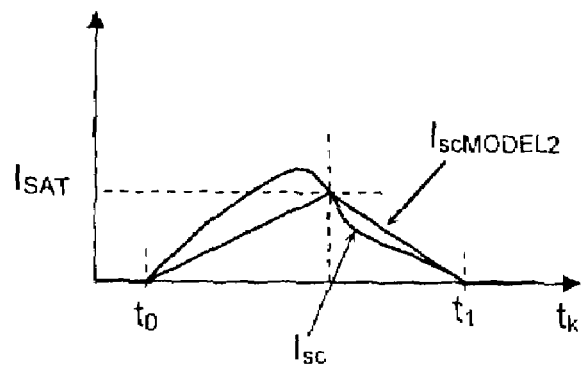
FIG. 3B is a second short-circuit current waveform model in accordance with an embodiment of the present invention.

Referring now to FIG. 3B, a second short-circuit current waveform model in accordance with an embodiment of the present invention is shown. A triangular current waveform is generated based on a determination of a saturation short-circuit current. The saturation short-circuit current is the current at the point where the difference between the input voltage waveform and output voltage waveform exceeds the threshold voltage of the transistor. The saturation short-circuit current model provides simplified calculation, as the method can solve for the point where the input voltage and output voltage differ by the threshold voltage of the transistor that is passing only the short-circuit current, whereas the maximum current model described above requires calculation of all of the points up to the maximum or a search for the maximum point. The saturation model also provides a result that may not over-estimate the short-circuit current to the degree that the maximum current model does, as the non-linear shape of the actual short-circuit current produces a waveform after the maximum point that falls short of the triangular prediction (as depicted in FIG. 3A).

The short-circuit current is determined by taking each of the values of the input voltage waveform $V_i[t_k]$ and the output voltage waveform $V_o[t_k]$ and calculating the current through transistor P1 using a device model for transistor P1. The short-circuit waveform can be partially or completely modeled and used as described above for the first model (maximum current model). Only a single current value $I_{sat}$ at is needed, as the triangular waveshape is fit to have an apex at $I_{sat}$ and a base extending from time $t_o$ (the delay time) to time $t_1$ (the time at which the short-circuit current falls to substantially zero). Note that the deviation between the triangular model of FIG. 3B and the actual short-circuit current is negative before the saturation point and positive after the saturation point as opposed to the prior-noted negative only deviation shown in FIG. 3A for the maximum short-circuit current model. For power dissipation calculations, the positive and negative deviations will cancel, at least in part, yielding a result that may be closer to the actual power dissipation that that produced by the maximum current model.

Figure 3C:
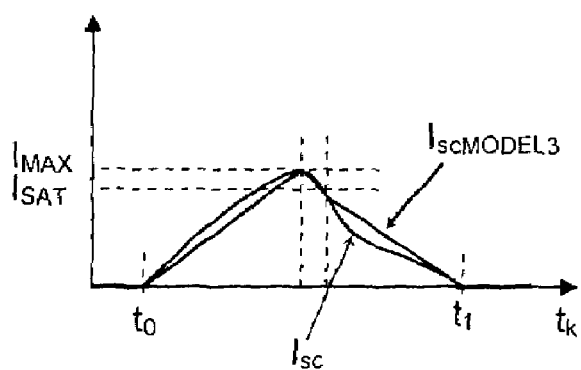
FIG. 3C is a third short-circuit current waveform model in accordance with an embodiment of the present invention.

Referring now to FIG. 3C, a third short-circuit current waveform model in accordance with an embodiment of the present invention is shown. A trapezoidal current waveform is generated based on a determination of both a maximum and a saturation short-circuit current as individually described above for the first and second models. The short-circuit waveform can be partially or completely modeled and used as described above for the first and second model . Both current values $I_{max}$ and $I_{sat}$ are needed, and the trapezoidal waveshape is fit to have an top extending from $I_{max}$ to $I_{sat}$ and a base extending from time $t_o$ (the delay time) to time $t_1$ (the time at which the short-circuit current falls to substantially zero).

Figure 4:
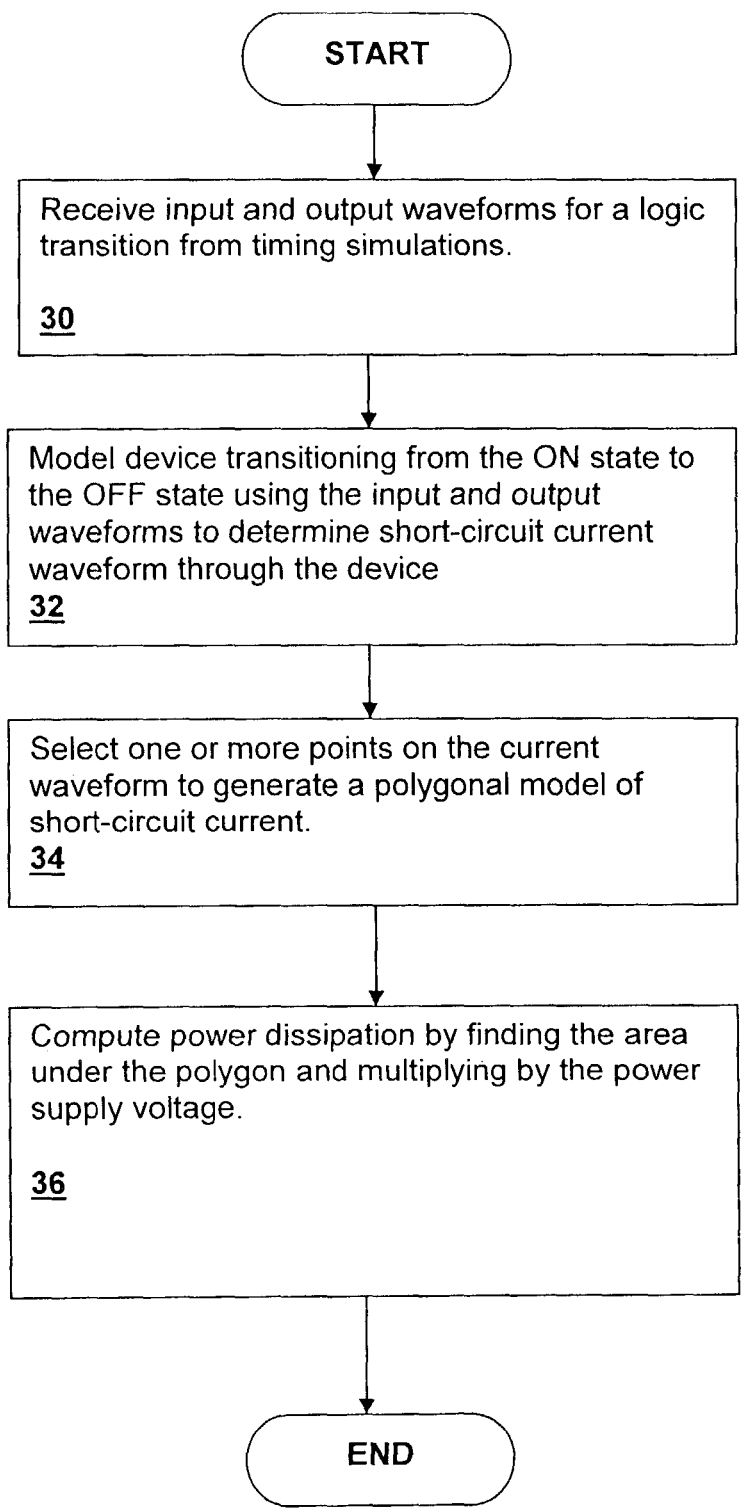
FIG. 4 is a flow chart depicting a method in accordance with an embodiment of the present invention.

Referring now to FIG. 4, a method in accordance with an embodiment of the present invention is depicted in a flowchart. A complementary circuit within the logical circuit block is simulated for timing analysis purposes and the input and output waveform data is supplied to and received (step 30) by the method of the present invention. The transistor transitioning from the ON state to the OFF state is selected and modeled to determine the short-circuit current waveform through the transistor (step 32). Then, one or more points (maximum, saturation or both) on the short-circuit waveform are selected to generate a polygonal model of the short-circuit current (step 34). Finally the power dissipation due to the short-circuit current is determined by finding the area under the polygon (step 36).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for modeling characteristics of a logical circuit, comprising:
    receiving input of a first plurality of values corresponding to points on an input voltage waveform of said logical circuit at discrete times, wherein said first plurality of values is a non-linear representation of said input voltage waveform;
    receiving input of a second plurality of values corresponding to points on an output voltage waveform of said logical circuit at said discrete times;
    selecting a particular one of said plurality of short-circuit current values;
    calculating a plurality of short-circuit current values forming a polygonal model of current through a given one of a complementary pair of transistors within said logical circuit for said discrete times in conformity with a model of said given transistor, a corresponding one of said first plurality of values, and a corresponding one of said second plurality of values, wherein a peak value of said polygonal model is equal to said selected particular one of said plurality of short-circuit current values, and wherein said polygonal model has a width equal to a time difference between a last one of said discrete times and a first one of said discrete times; and
    displaying a result of said calculating.

2. The method of claim 1, further comprising selecting said given one of said complementary pair of transistors in conformity with a transition direction of said input voltage waveform.

3. The method of claim 1, further comprising generating said polygonal model as a triangular model of said short-circuit current having an apex equal to said selected short-circuit current value.

4. The method of claim 3, further comprising calculating a short-circuit power dissipation as one half of the product of said selected short-circuit current value and a power supply voltage of said logic circuit divided by said time difference.

5. The method of claim 3, wherein said logic circuit comprises a plurality of complementary circuits, wherein said triangular model is generated for said plurality of complementary circuits and further comprising summing said plurality of triangular models to determine a total short-circuit current for a power distribution network of said logic circuit.

6. The method of claim 3, wherein said selected short-circuit current value is a maximum short-circuit current value.

7. The method of claim 3, wherein said selected short-circuit current value is a short-circuit current value for which said given transistor has entered saturation.

8. The method of claim 1, further comprising:
    selecting another one of said plurality of short-circuit current values corresponding to a short-circuit current value for which said at least one transistor has entered saturation; and
    generating said polygonal model as a trapezoidal model of said short-circuit current conforming to both of said selected short-circuit current values.

9. The method of claim 1, further comprising:
    piecewise-integrating a result of said calculating; and
    multiplying a result of said integrating by a power supply voltage to determine a power dissipation.

10. A computer program product for use with a workstation computer, wherein said computer program product comprises a storage media containing program instructions for execution within said workstation computer for modeling characteristics of a logical circuit, and wherein said program instructions comprise program instructions for:
    receiving input of a first plurality of values corresponding to points on an input voltage waveform of said logical circuit at discrete times, wherein said first plurality of values is a non-linear representation of said input voltage waveform;
    receiving input of a second plurality of values corresponding to points on an output voltage waveform of said logical circuit at said discrete times;
    selecting a particular one of said plurality of short-circuit current values;
    calculating a plurality of short-circuit current values forming a polygonal model of current through a given one of a complementary pair of transistors within said logical circuit for said discrete times in conformity with a model of said given transistor, a corresponding one of said first plurality of values, and a corresponding one of said second plurality of values, wherein a peak value of said polygonal model is equal to said selected particular one of said plurality of short-circuit current values, and wherein said polygonal model has a width equal to a time difference between a last one of said discrete times and a first one of said discrete times; and
    displaying a result of said calculating.

11. The computer program product of claim 10, wherein said program instructions further comprise program instructions for said given one of said complementary pair of transistors in conformity with a transition direction of said input voltage waveform.

12. The computer program product of claim 10, wherein said program instructions further comprise program instructions for generating said polygonal model as a triangular model of said short-circuit current having an apex equal to said selected short-circuit current value.

13. The computer program product of claim 12, wherein said program instructions further comprise program instructions for calculating a short-circuit power dissipation as one half of the product of said selected short-circuit current value and a power supply voltage of said logic circuit divided by said time difference.

14. The computer program product of claim 12, wherein said logic circuit comprises a plurality of complementary circuits, wherein said program instructions for generating generate triangular models for said plurality of complementary circuits and further comprising program instructions for summing said plurality of triangular models to determine a total short-circuit current for a power distribution network of said logic circuit.

15. The computer program product of claim 12, wherein said selected short-circuit current value is a maximum short circuit current value.

16. The computer program product of claim 12, wherein said selected short-circuit current value is a short-circuit current value for which said at least one transistor has entered saturation.

17. The computer program product of claim 10, wherein said program instructions further comprise program instructions for:
    selecting another one of said plurality of short-circuit circuit current values corresponding to a short-circuit current value for which said at least one transistor has entered saturation; and
    generating said polygonal model as a trapezoidal model of said short-circuit current conforming to both of said selected short-circuit current values.

18. The computer program product of claim 10, wherein said program instructions further comprise program instructions for:
    piecewise-integrating a result of said calculating; and
    multiplying a result of said integrating by a power supply voltage to determine a power dissipation.

19. A workstation comprising:
    a memory for storing program instructions and data values for modeling characteristics of a logical circuit;
    a processor for executing said program instructions, wherein said program instructions comprise program instructions for
    receiving input of a first plurality of values corresponding to points on an input voltage waveform of said logical circuit at discrete times, wherein said first plurality of values is a non-linear representation of said input voltage waveform;
    receiving input of a first plurality of values corresponding to points on an input voltage waveform of said logical circuit at discrete times, wherein said first plurality of values is a non-linear representation of said input voltage waveform;
    receiving input of a second plurality of values corresponding to points on an output voltage waveform of said logical circuit at said discrete times;
    selecting a particular one of said plurality of short-circuit current values;
    calculating a plurality of short-circuit current values forming a polygonal model of current through a given one of a complementary pair of transistors within said logical circuit for said discrete times in conformity with a model of said given transistor, a corresponding one of said first plurality of values, and a corresponding one of said second plurality of values, wherein a peak value of said polygonal model is equal to said selected particular one of said plurality of short-circuit current values, and wherein said polygonal model has a width equal to a time difference between a last one of said discrete times and a first one of said discrete times; and
    displaying a result of said calculating.

20. The workstation of claim 19, wherein said program instructions further comprise program instructions for said given one of said complementary pair of transistors in conformity with a transition direction of said input voltage waveform.

21. The workstation of claim 19, wherein said program instructions further comprise program instructions for generating said polygonal model as a triangular model of said short-circuit current having an apex equal to said selected short-circuit current value.

22. The workstation of claim 19, wherein said program instructions further comprise program instructions for calculating a short-circuit power dissipation as one half of the product of said selected short-circuit current value and a power supply voltage of said logic circuit divided by said time difference.

23. The workstation of claim 21, wherein said logic circuit comprises a plurality of complementary circuits, wherein said program instructions for generating generate triangular models for said plurality of complementary circuits and further comprising program instructions for summing said plurality of triangular models to determine a total short-circuit current for a power distribution network of said logic circuit.

24. The workstation of claim 21, wherein said selected short-circuit current value is a maximum short-circuit current value.

25. The workstation of claim 21, wherein said selected short-circuit current value is a short-circuit current value for which said at least one transistor has entered saturation.

26. The workstation of claim 19, wherein said program instructions further comprise program instructions for:
    selecting another one of said plurality of short-circuit circuit current values corresponding to a short-circuit current value for which said at least one transistor has entered saturation; and
    generating said polygonal model as a trapezoidal model of said short-circuit current conforming to both of said selected short-circuit current values.

27. The workstation of claim 19, wherein said program instructions further comprise program instructions for:
    piecewise-integrating a result of said calculating; and
    multiplying a result of said integrating by a power supply voltage to determine a power dissipation.

* * * * *